United States Patent [19]

Poguntke

[11] 3,906,212

[45] Sept. 16, 1975

[54] SERIES-COUPLED EMITTER COUPLED LOGIC (ECL) CIRCUIT HAVING A PLURALITY OF INDEPENDENTLY CONTROLLABLE CURRENT PATHS IN A LOWER PLANE

[75] Inventor: Dieter Poguntke, Munich, Germany

[73] Assignee: Siemens Aktiengesellschaft, Berlin & Munich, Germany

[22] Filed: Aug. 20, 1974

[21] Appl. No.: 498,967

Related U.S. Application Data

[63] Continuation of Ser. No. 419,144, Nov. 26, 1973, abandoned, which is a continuation of Ser. No. 274,260, July 24, 1972, abandoned.

[30] Foreign Application Priority Data

Aug. 18, 1971 Germany ........................ 2141415

[52] U.S. Cl. ................................ 235/176; 307/203

[51] Int. Cl.[2] ...................... G06F 7/50; G03K 19/08

[58] Field of Search ............ 235/176; 307/203, 207

[56] References Cited

UNITED STATES PATENTS

| | | | |
|---|---|---|---|
| 3,504,192 | 3/1970 | Stopper | 307/203 |
| 3,515,904 | 6/1970 | Stopper | 307/207 X |
| 3,519,810 | 7/1970 | Priel et al. | 235/176 |
| 3,649,844 | 3/1972 | Kroos | 235/176 |
| 3,681,614 | 8/1972 | Kroos | 307/203 |

*Primary Examiner*—David H. Malzahn
*Attorney, Agent, or Firm*—Hill, Gross, Simpson, Van Santen, Steadman, Chiara & Simpson

[57] ABSTRACT

Emitter-coupled logic (ECL) circuit employs differential amplifiers arranged in upper and lower planes and selectively controlled by respective groups of input signals. Each differential amplifier of the upper plane has the emitters of its transistors connected to the collector of a transistor in one branch of the differential amplifier of the lower plane. Additional parallel connected transistors provide an OR function of several input signals in the upper plane for each of the differential amplifiers of that plane and the input signals of the lower plane are applied to each differential amplifier of the upper plane, with the exception of the input signal associated with the branch of the lower plane differential amplifier associated with a particular upper plane differential amplifier.

2 Claims, 4 Drawing Figures

SERIES-COUPLED EMITTER COUPLED LOGIC (ECL) CIRCUIT HAVING A PLURALITY OF INDEPENDENTLY CONTROLLABLE CURRENT PATHS IN A LOWER PLANE

This is a continuation of application Ser. No. 419,144, filed Nov. 26, 1973, which is a continuation of Ser. No. 274,260, filed July 24, 1972, both abandoned.

BACKGROUND OF THE INVENTION

1. Field of the Invention

This invention relates to emitter-coupled logic circuits including differential amplifiers formed of emitter-coupled transistors which are arranged in several "planes" in such a way that additional differential amplifiers of upper planes are connected into the current paths of differential amplifiers of lower planes.

2. Description of the Prior Art

The basic circuit of the so-called emitter-coupled logic (ECL) circuits consists of a differential amplifier having two transistors whose emitters are interconnected and which are jointly fed with approximately constant current. The base of one of the transistors forms a control input; the base of the other transistor is connected to a fixed reference potential which is at least approximately equal to the arithmetic mean of the high and the low control potential. By means of expanding the basic circuit and/or by means of combining several differential amplifiers, many different logical functions can be realized with the help of emitter-coupled logic circuits. For example, the collector-emitter paths of additional transistors, also controlled at the in bases, and of the same conduction type are connected in parallel for the formation of OR or NOR functions of the collector-emitter path of the controlled transistor. (See for example, "Computer Design" December 1962, pages 26–30.) Other logical functions result since differential amplifiers are again connected into the individual current paths of differential amplifiers. Such a measure is called series coupling (series gating). Basically, a superposition in several planes is possible. The data sheet NECL III MC 1082 of the firm of Motorola, Motorola, and U.S. Pat. No. 3,519,810 granted to Priel et al., for example, show a circuit arrangement, constructed according to this principle in three planes, for the formation of the carry-over function during the addition of binary numbers. The series coupling and three planes, however, already shows certain drawbacks which are not further treated herein. On the other hand, the limitation of the series coupling to two planes will, first of all, cause a decrease of the possibilities for the logical linkage of input signals in view of the number of input signals, or, in view of the degree of the logical linkage, which, can, however, be balanced again by other circuit measures.

SUMMARY OF THE INVENTION

The invention has as its primary object the provision of a series-coupled emitter-coupled logic circuit which, according to the kind generally described above, comprises at least one differential amplifier in a lower plane with several current paths independently controllable by means of input signals of a first group, wherein additional differential amplifiers of an upper plane are connected, which can be controlled by input signals of a second group, and designed in such a way that delay times between the application of high and low input signals can be eliminated.

According to this invention, such a circuit is characterized in that the collector-emitter paths of additional controlled transistors for the formation of OR functions of several input signals are connected in parallel with the collector-emitter paths of the controlled transistors of the differential amplifiers of the upper plane, and that, in addition to an input signal of the second group, all input signals of the first group are applied to each differential amplifier of the upper plane, except for the input signal for the control of the current path associated with the respective differential amplifier.

BRIEF DESCRIPTION OF THE DRAWINGS

Other objects, features and advantages of the invention, its organization, construction and operation will be best understood from the following detailed description of preferred embodiments thereof, taken in conjunction with the accompanying drawings, on which.

DESCRIPTION OF THE PREFERRED EMBODIMENTS

In connection with a circuit arrangement generally known as a D flip-flop with multiple control, due to its logical function, it has been suggested to expand the differential amplifier in the lower plane in such a manner that the emitters of additional transistors of the same conductivity type, controlled at their bases, are connected to the connection point of the emitters of the two transistors of the basic circuit. The control part of such a circuit arrangement has been illustrated in FIG. 1. As can be seen, the collector of the additional transistor T3 is not connected with the collector of the controlled transistor T2 of the basic circuit, as opposed to the prior art OR/NOR circuit, but forms a separate, independently-controllable current path into which a further differential amplifier with the transistors T4, T5 has been connected. A differential amplifier with the transistors T6, T7 have also been connected into the collector circuit of the transistor T2.

The collectors of the transistors T4 and T6, on one hand, and the transistors T1, T5 and T7 on the other hand, are respectively connected together and connected with the positive pole VCC of an operational voltage source, which source forms a reference potential, as well as being connected with the base of one of the transistors T8 and T9, via one of the collector resistors R1 and R2. The transistors T8 and T9 are connected as emitter followers and, as it is known, serve for increasing the resistance of the circuit at the output terminals X and $\overline{X}$, and in order to equalize the levels of the output signals to the signal levels required for the input signals (of the upper plane). The emitters of the transistors T1, T2 and T3 of the differential amplifier of the lower plane, as it is known, are connected to the negative pole VEE of the operational voltage source, via the constant current generator S which supplies the impressed current I. The bases of the transistors T5 and T7 in the upper plane, which are not directly controlled, and the base of the transistor T1 in the lower plane are connected to the fixed reference potentials VR1 and VR2, respectively.

Figure 1:
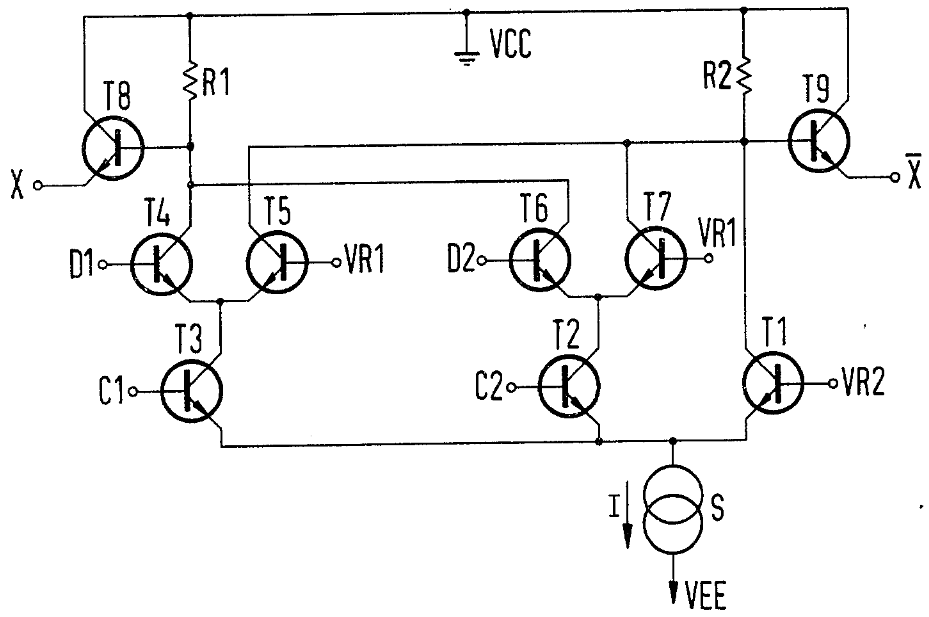
FIG. 1 is a schematic circuit diagram of an ECL circuit.

If the signals are denoted in the same manner as the terminals where they occur, the following logical functions will result for the circuit according to FIG. 1:

$$X = (\overline{D1} + \overline{C1}) \,.\, (\overline{D2} + \overline{C2})$$
$$\overline{X} = D1 \,.\, C1 + D2 \,.\, C2$$

The provision that a high signal level may only be provided at one of the inputs C1 or C2, with independent D signals, will always be true for the circuit as illustrated in FIG. 1, since otherwise a distribution of the current I through the resistors R1 and R2 can be effected which would cause inapplicable intermediate logical states. In order to avoid this safely, even if the high signal level changes between the inputs C1 and C2, a certain minimum waiting time must be maintained between the transition from the high to the low signal level at one of the input terminals and the transition from the low to high signal level at the other input terminal.

Figure 2:
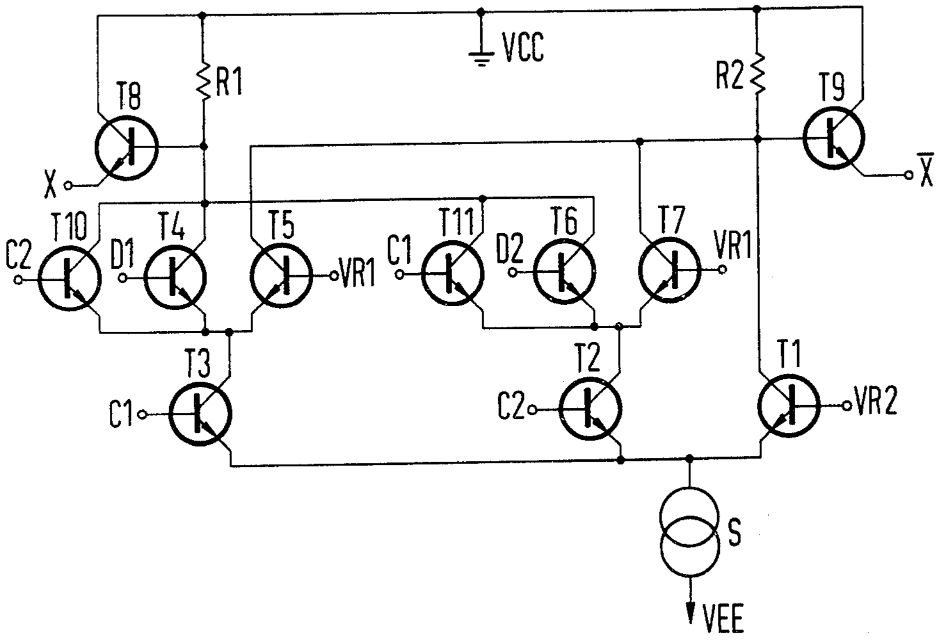
FIG. 2 is a schematic diagram of a circuit constructed according to the present invention.

The circuit illustrated in FIG. 2 corresponds to a far degree with the arrangement as described with the help of FIG. 1. Equal elements have therefore been provided with the same reference numerals. Deviating from the arrangement according to FIG. 1, however, the collector-emitter path of an additional base-controlled transistor T10 or T11, respectively, is connected in parallel with the collector-emitter paths of the controlled transistors T4, T6 of the two differential amplifiers of the upper plane, with the circuit according to the invention (FIG. 2). Such a parallel connection of transistors in a branch of a differential amplifier as it is known, results in a OR or NOR linkage of the signals applied to the bases of the transistors. In the present case, the signal C2 will now be applied to the base of the additional transistor T10, in the current path controlled by the signal C1, and the signal C1 to the base of the additional transistor T11, in the current path controlled by the signal C2.

Thus, the following logical linkages result for the circuit according to FIG. 2:

$$X = (\overline{C2} \,.\, \overline{D1} + \overline{C1}) \,.\, (\overline{C1} \,.\, \overline{D2} + \overline{C2})$$
$$\overline{X} = (C2 + D1) \,.\, C1 + (C1 + D2) \,.\, C2 \,.$$

It can be recognized from the above relations that, independent of the level of the D signals, the level at output X is low, and the level at output $\overline{X}$ is high, when the levels of the signals C1 and C2 are high simultaneously. This means that now clear conditions are given in each case at outputs X and $\overline{X}$, and thus it is no longer necessary to pay attention to allowed and not-allowed combinations of the input signals.

Figure 3:
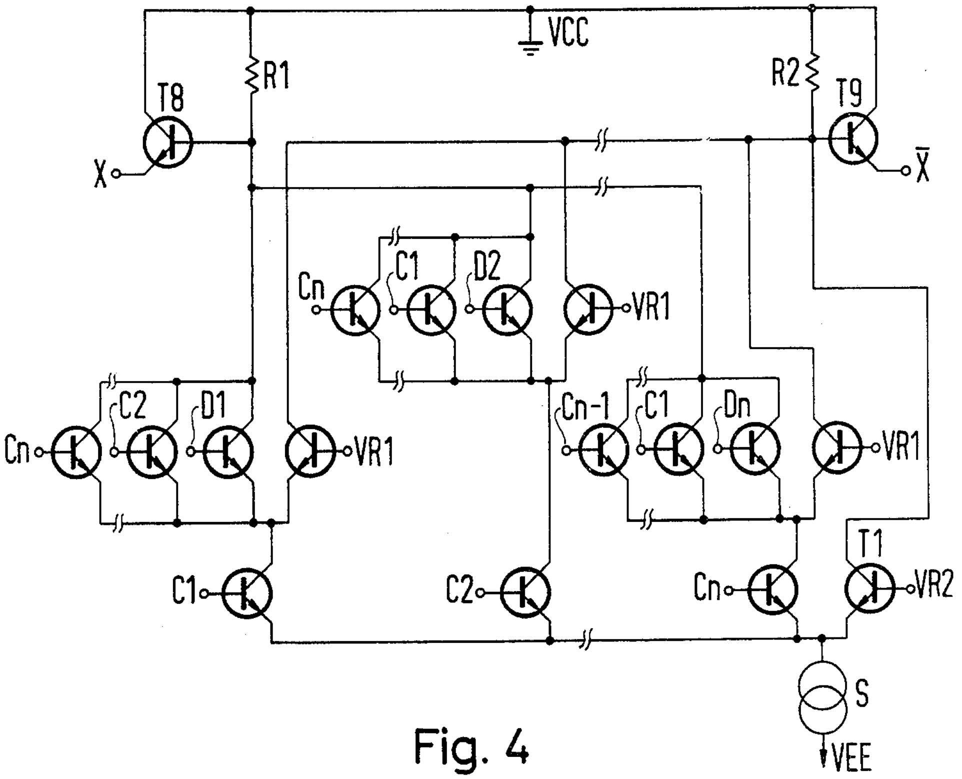
FIG. 3 is another circuit according to the invention.

The measure according to this invention is not limited to two independently controllable current paths in the differential amplifier of the lower plane. It can also be applied in an analogous manner when (within the framework of the technically useful) a desired number of such current paths is present. FIG. 3 illustrates a circuit with a differential amplifier in the lower plane, comprising *n* current paths which can be independently controlled by *n* input signals C1 through C*n* of a first group. A differential amplifier of the upper plane is connected into each one of the current paths, and it is constructed to the manner of the prior art OR circuit and also comprises *n* control inputs. One of the input signals D1 through Dn of a second group will respectively be connected to the input of a differential amplifier, and the group of signals form the control signals for the differential amplifiers of the upper plane. The remaining inputs of the differential amplifiers are now provided with all control signals C of the first group, as auxiliary signals, so-to-say, but always with the exception of that signal controlling the current path feeding the respective differential amplifier in the upper plane. If now, for example, a certain current path is controlled by the signal C1 at the associated differential amplifier of the upper plane by the signal D1, the signals C2 through C*n* will be applied to the remaining $n - 1$ inputs of the differential amplifier.

Figure 4:
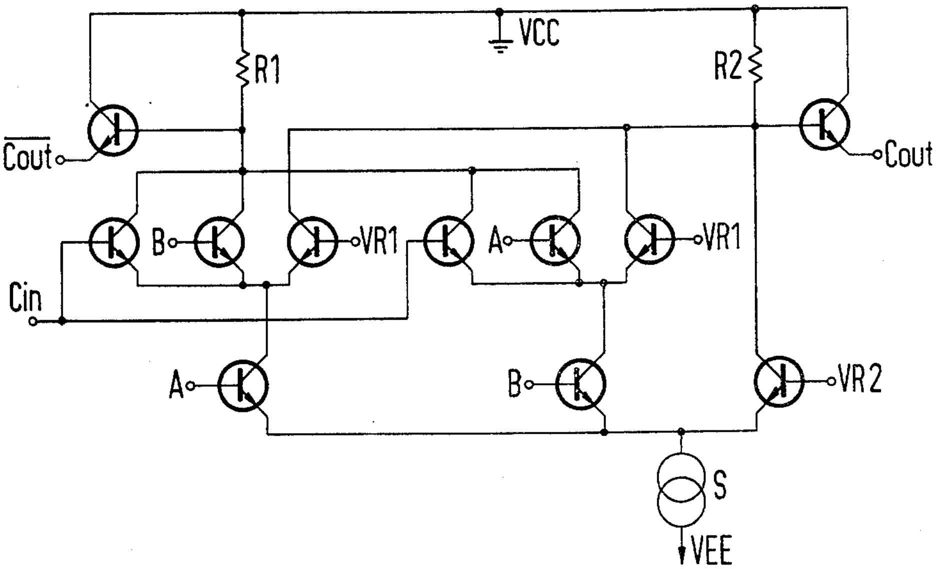
FIG. 4 is a circuit for the formation of the carry-over function according to the invention.

The application of the circuit principle according to this invention allows the construction of an advantageous circuit arrangement with a small signal delay time for the formation of a carry-over function during the addition of binary numbers. The circuit arrangement as illustrated in FIG. 4 resembles to a far degree to the circuit according to FIG. 2. Merely the inputs denoted D1 and D2 in FIG. 2 are now connected together and receive the carry-over signal C*in* which characterizes the presence of a carry-over from the preceding stage. The signals corresponding to the two terms of a sum A and B are not only applied to the inputs A and B for the control of the two independent current paths of the differential amplifiers of the lower plane, according to this invention, but also, in an exchanged association, to the additional inputs at the differential amplifiers of the upper plane, in order to produce a OR linkage. Then, the signal corresponding to the new carry-over will be given at the output C*out*, according to the relation C*out* = A.B+A.C*in* +B.C*in* +*A.B.Cin*.

Although I have described my invention by reference to specific embodiments thereof, many changes and modifications may become readily apparent to one skilled in the art without departing from the spirit and scope of the invention. I therefore intend to include within the patent warranted hereon all such changes and modifications as may reasonably and properly be included within the scope of my contribution to the art.

I claim:

1. In a series-coupled emitter-coupled logic circuit of the type having a first differential amplifier in a lower plane and second differential amplifiers in an upper plane, wherein the first differential amplifier includes a plurality of first transistors each having a base, an emitter and a collector, the emitters connected together for connection to a constant current supply, the base of one of said first transistors connected to a reference potential and the bases of the other first transistors serving to receive respective input signals of a first group of input signals for independently controlling the current paths through the respective transistors, wherein each second differential amplifier includes a pair of second transistors each having a base, an emitter and a collector, the emitters of each pair of second transistors connected to the collector of a respective controllable first transistor of the first differential amplifier, the base of one second transistor of each pair connected to a reference potential and the base of the other second transistor of each pair serving to receive a respective input signal of a second group of input signals for independently controlling the current paths through the respective transistors, wherein a first collector resistor connects the collectors of the controllable second transistors of the second differential amplifiers in the upper plane to an operating potential and a second collector resistor connects the collectors of the reference one first transistor in the lower plane and the referenced one second transistor of each second differential amplifier in the upper plane to the operating potential, wherein a first output transistor operates as an emitter follower for the controllable second transistors in the upper plane and a second output transistor operates as an emitter follower for the referenced transistors in the upper and lower planes, the first output transistor having a base connected in common with the collectors of the controllable transistors in the upper plane and to the first collector resistor, an emitter serving as a first output, and a collector connected in common with the first collector resistor and the operating potential, the second output transistor having a base connected in common with the collectors of the referenced transistors in the upper and lower planes and to the second collector resistor, an emitter serving as a second output, and a collector connected to the second collector resistor and to the operating potential, the improvement therein comprising:

at least one additional second transistor in each second differential amplifier of the upper plane, each said additional second transistor having an emitter connected to the other emitters of the respective second differential amplifier and a collector connected to the collector of a controllable second transistor of the respective second differential amplifier to form an OR linkage, and a base for receiving an input signal from the first group of input signals, wherein the input signals applied to the bases of the additional second transistors excludes the input signal of the first group applied to the base of the respective controllable transistor which has its collector connected to the emitters of the respective second differential amplifier.

2. The logic circuit of claim 1, further defined by an improvement for a carry-over function for binary addition, comprising means connecting the bases of a controllable second transistor of each second differential amplifier to receive a common input signal as a carry-over signal.

* * * * *